United States Patent
Bernard et al.

(10) Patent No.: US 8,728,715 B2
(45) Date of Patent: May 20, 2014

(54) NON-PHOTOSENSITIVE SILOXANE COATING FOR PROCESSING HYDROPHOBIC PHOTOIMAGEABLE NOZZLE PLATE

(75) Inventors: David Bernard, Lexington, KY (US); Paul Dryer, Lexington, KY (US); Bart Mansdorf, Lexington, KY (US); Xiaoming Wu, Lexington, KY (US)

(73) Assignee: Funai Electric Co., Ltd., Osaka (JP)

( * ) Notice: Subject to any disclaimer, the term of this patent is extended or adjusted under 35 U.S.C. 154(b) by 68 days.

(21) Appl. No.: 13/350,155

(22) Filed: Jan. 13, 2012

(65) Prior Publication Data

US 2013/0183450 A1    Jul. 18, 2013

(51) Int. Cl.
*G03F 7/26* (2006.01)
(52) U.S. Cl.
USPC .......................................... 430/315; 430/330
(58) Field of Classification Search
USPC .......................... 430/322, 330, 329, 324, 315
See application file for complete search history.

(56) References Cited

U.S. PATENT DOCUMENTS

| 5,069,998 | A | 12/1991 | Schwalm |
| 6,283,584 | B1 | 9/2001 | Powers |
| 6,512,075 | B1 | 1/2003 | Tzou |
| 7,364,268 | B2 | 4/2008 | Hart |
| 2004/0087690 | A1 | 5/2004 | Lamanna |
| 2006/0221115 | A1 | 10/2006 | Patil |
| 2009/0186293 | A1* | 7/2009 | Fannin et al. ............... 430/270.1 |
| 2010/0273110 | A1* | 10/2010 | Ogihara et al. ............... 430/324 |

* cited by examiner

*Primary Examiner* — Caleen Sullivan
(74) *Attorney, Agent, or Firm* — Amster, Rothstein & Ebenstein LLP

(57) ABSTRACT

A method of forming a patterned photoresist layer having a hydrophobic surface is provided. The method includes forming a photoresist layer on a substrate and image patterning. The photoresist layer may comprise a polymeric material. The imaged photoresist layer may then undergo a two-stage post-exposure bake. A surface treatment may be performed on the photoresist layer in between the two-stage post-exposure bake. The surface treatment may include applying a siloxane solution on a partially post-exposure baked photoresist layer. The post-exposure baked photoresist layer may then be developed to form the patterned photoresist layer. The method may be used to form a hydrophobic photoimageable nozzle plate of a micro-fluid ejection head having improved mechanical properties and stable hydrophobic properties.

22 Claims, 4 Drawing Sheets

NON-PHOTOSENSITIVE SILOXANE COATING FOR PROCESSING HYDROPHOBIC PHOTOIMAGEABLE NOZZLE PLATE

CROSS REFERENCES TO RELATED APPLICATIONS

None.

STATEMENT REGARDING FEDERALLY SPONSORED RESEARCH OR DEVELOPMENT

None.

REFERENCE TO SEQUENTIAL LISTING, ETC

None.

BACKGROUND

1. Field of the Disclosure

The present disclosure generally relates to micro-fluid ejection devices and, more particularly, to a micro-fluid ejection head having hydrophobic nozzle plate.

2. Description of the Related Art

The degree of hydrophobicity/hydrophilicity of a micro-fluid ejection head plays an important role in the overall performance of a micro-fluid ejection device. For example, as the size of the nozzles in the nozzle plate shrinks in order to get smaller droplet sizes, the sensitivity of the fluid ejected to the surface energy of the nozzle plate increases dramatically. One factor that contributes to this phenomenon is the accumulation of fluid or other contaminants on the nozzle plate surface. Such accumulation of fluid on the nozzle plate may adversely affect both the size and placement accuracy of the fluid droplets ejected from the ejection head. Therefore, the nozzle plate surface should be made hydrophobic to prevent the accumulation of fluids or other contaminants thereon.

The micro-fluid ejection head may be provided with a dual layer hydrophobic photoimageable nozzle plate (hPINP). Such micro-fluid ejection head may be manufactured by laminating a pre-formed dual layer photoresist film including a hydrophobic layer and a non-hydrophobic layer to a microfluid-ejection head structure with the non-hydrophobic layer being an attaching layer and the hydrophobic layer being an outer layer. The laminated dual layer photoresist film is then exposed and developed to provide nozzle holes. A single layer non-hydrophobic photoresist material may be deposited to the micro-fluid ejection head structure and then coated with hydrophobic resin layer. The single layer non-hydrophobic photoresist material and the hydrophobic resin layer may be simultaneously exposed or have a separate exposure step, and are then simultaneously developed to provide nozzle holes and form the dual layer hPINP. However, this type of dual layer hPINP manufactured either through liquid formulation or wafer level processed dry film laminates possess material incompatibility issues which inherently may lead to phase or layer separation.

A fabricated micro-fluid ejection head having a nozzle plate with non-hydrophobic surface may also be made hydrophobic through vapor deposition or spray coating of a hydrophobic resin layer. The extra post-nozzle-formation processing step required to generate the hydrophobic layer on the nozzle plate surface exposes the micro-fluid ejection head to significant threat of device contamination. Furthermore, the formed hydrophobic layer may lack good mechanical properties, and the hydrophobic characteristic of the nozzle plate may not be sustained for an extended period of time.

Thus, there is a need for hPINP with both improved mechanical properties and stable hydrophobic properties.

SUMMARY

The present disclosure provides a method of forming a patterned photoresist layer having a hydrophobic surface. The method includes forming a photoresist layer on a substrate. The photoresist layer may comprise a polymeric material. Image patterning may then be performed on the photoresist layer. The imaged photoresist layer may then undergo a two-stage post-exposure bake. A surface treatment may be performed on the photoresist layer in between the two-stage post-exposure bake. The surface treatment may include applying a siloxane solution on a partially post-exposure baked photoresist layer. The post-exposure baked photoresist layer is then developed to form the patterned photoresist layer.

Example of patterned photoresist layer formed by the method of the present disclosure may be the hPINP of the micro-fluid ejection head. Such formed hPINP of the micro-fluid ejection head have improved mechanical properties and stable hydrophobic properties, thus overcoming shortcomings of prior hPINP.

BRIEF DESCRIPTION OF THE DRAWINGS

The above-mentioned and other features and advantages of the various embodiments of the invention, and the manner of attaining them, will become more apparent and will be better understood by reference to the accompanying drawings, wherein.

DETAILED DESCRIPTION

Figure 1:
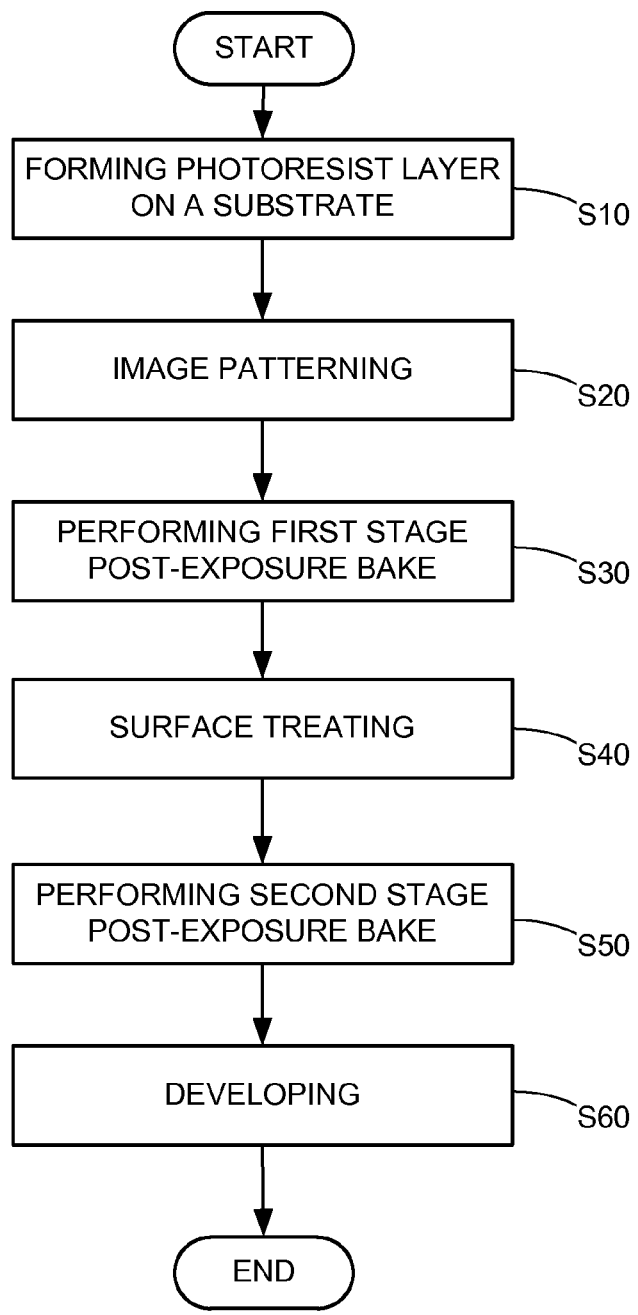
FIG. 1 is a schematic representation of a method of forming a patterned photoresist layer having a hydrophobic surface.

It is to be understood that the invention is not limited in its application to the details of construction and the arrangement of components set forth in the following description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the terms "a" and "an" herein do not denote a limitation of quantity, but rather denote the presence of at least one of the referenced item.

Reference will now be made in detail to the example embodiment(s), as illustrated in the accompanying drawings. Whenever possible, the same reference numerals will be used throughout the drawings to refer to the same or like parts.

Figure 2:
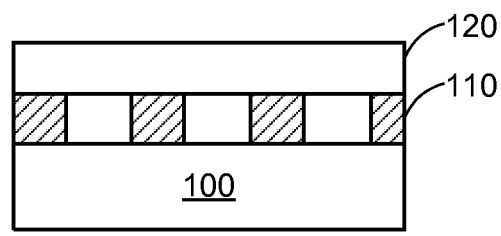
FIGS. 2-7 are cross-sectional views of micro-fluid ejection head formed according the method presented in FIG. 1.

The present disclosure provides a method of forming a patterned photoresist layer having a hydrophobic surface. Referring to FIG. 1, in step S10, a photoresist layer is formed on a substrate. The term "substrate" refers to any supporting structure including, but not limited to, a wafer. The wafer may be either alone or in assemblies comprising other materials thereon. In one example embodiment, the substrate may comprise the supporting structure of a micro-fluid ejection head device. Referring to FIG. 2, the substrate 100 may include the wafer having formed thereupon a flow feature layer 110. The photoresist layer 120 may comprise a polymeric material with photoacid generator. Furthermore, with reference to FIG. 2, the photoresist layer 120 may be applied on the flow feature layer 110 through lamination in a form of dry film, or through spin coating or spray coating in the form of liquid formulation. In one example embodiment the photoresist layer 120 may comprise polyimide or an epoxy functionalized polymeric material to be used as a nozzle plate material for the micro-fluid ejection head device. The photoresist layer 120 may comprise a negative type photoresist material which may cross-link upon exposure to radiation and subsequently to heat, and become insoluble in a developing solvent.

Figure 3:
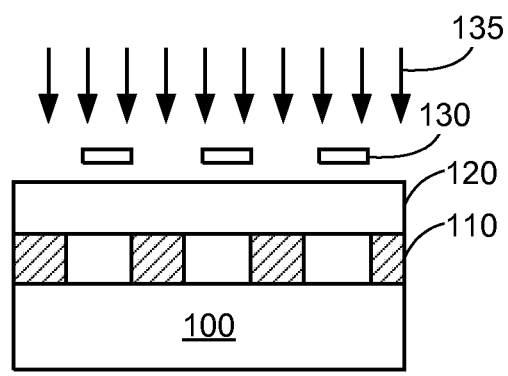

In step S20, image patterning is performed. The photoresist layer 120 may be exposed through a mask 130 to a radiation 135 as shown in FIG. 3. The irradiation may induce generation of photoacid in the photoresist layer 120.

Figure 4:
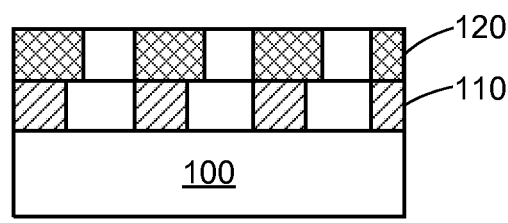

The irradiated photoresist layer 120 may then be baked. The post-exposure bake (PEB) of the photoresist layer 120 may be split into two stages including a first stage PEB, wherein the imaged photoresist layer 120 is partially baked, and a second stage PEB. At the completion of both stages, the imaged photoresist layer 120 is fully baked. In step S30, the first stage PEB is performed. Referring to FIG. 4, the photoresist layer 120 may be baked at conditions sufficient for inducing partial cross-linking to make the imaged photoresist layer 120 more robust and have better mechanical strength and solvent resistance. Preferably, the first stage PEB may comprise baking at about 80° C. to about 120° C. for about 60 to about 180 seconds. More preferably, the first stage PEB comprises baking at about 100° C. to about 110° C. for about 90 to about 120 seconds.

Figure 5:
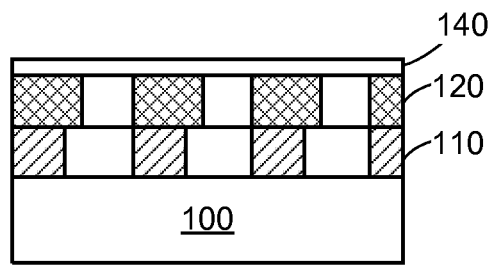

After performing the first stage PEB but before performing the second stage PEB, the photoresist layer 120 may be surface treated. In step S40, the partially baked or cross-linked photoresist layer 120 is surface treated with a resin formulation in a hydrocarbon carrier solvent. The resin formulation may be prepared to have low viscosity and low surface tension. In one example embodiment, the resin formulation may be applied by spin coating or spray coating onto the top surface of the partially baked photoresist layer 120. Referring to FIG. 5, the photoresist layer 120 may then be deposited with a resin layer 140 after the hydrocarbon carrier solvent evaporates.

The resin in the surface treatment formulation may contain functional groups that may be polymerized through cationic mechanism. In one example embodiment, the resin formulation may comprise a siloxane-based resin having at least two epoxy groups per molecule. The epoxy functionality may be a terminal group or a pendant group. The epoxy functionalized siloxane resin may contain glycidyl ether group or cyclohexene oxide group. Suitable examples of epoxy functionalized siloxane resin includes polydimethylsiloxane having glycidyl ether terminal groups represented by the following formula (I):

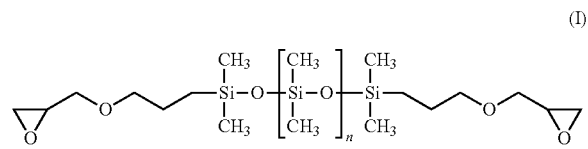

(I)

or polysiloxane having cyclohexene oxide pendant group represented by the following formula (II):

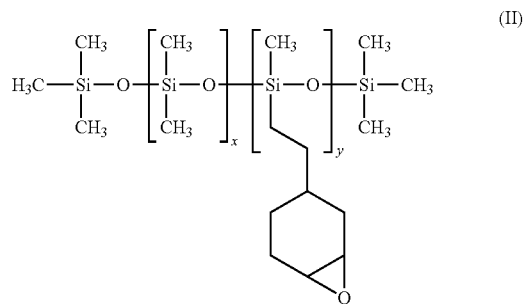

(II)

wherein repeating unit n ranges from 0 to 20, repeating unit x ranges from 1.5 to 10, and repeating unit y ranges from 9 to 100. In some example embodiments, the resin formulation may comprise a functionalized fluorinated resin or polynorbonene-based resin.

The resin formulation in the layer 140 may be prepared by dissolving the resin in hydrocarbon solvents. The resin content in the formulation may range from about 0.5 to about 10 percent by weight. The type of hydrocarbon solvent may be selected to ensure that the resin formulation will not interfere with the latent image and the acid diffusion/migration in the imaged photoresist layer 120. The hydrocarbon solvents may include an aliphatic hydrocarbon, an aromatic hydrocarbon, or a mixture thereof. The aliphatic and aromatic hydrocarbon solvents may be mixed at a weight ratio of 0:100 to 100:0. Preferably, the aliphatic and aromatic hydrocarbon solvents mixing weight ratio may be about 0:100 to about 60:40. The mixing ratio of the hydrocarbon solvents may be selected to optimize the vaporization of solvent and deposition of resin on the treated surface. The aliphatic hydrocarbon solvents may include, but are not limited to, pentanes, hexanes, cyclohexane, heptanes, octanes and petroleum ether. The aromatic hydrocarbon solvents may include, but are not limited to, benzene, toluene, xylene and mesytilene. In one example embodiment the hydrocarbon carrier solvent may include xylene and hexanes at a weight mixing ratio of about 1:1. Furthermore, the resin formulation may be non-photosensitive or may not include photosensitive additive such as photoacid generator (PAG).

Figure 6:
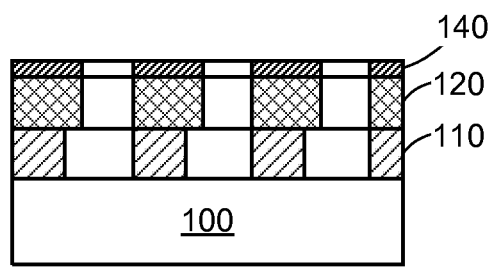

In step S50, the second stage PEB is performed on the surface treated photoresist layer 120. The second stage PEB may comprise baking at about 80° C. to about 120° C. for about 360 to about 600 seconds. Preferably, the second stage PEB comprises baking at about 100° C. to about 110° C. for about 400 to about 480 seconds. This second stage PEB may facilitate diffusion of the photoacid into the deposited resin layer 140 to induce cross-linking reaction. At this stage the functional group of the resin layer 140 may react with the active sites of the polymeric photoresist layer 120. The functional group of the resin layer 140 at the top surface of the photoresist layer 120 may covalently bond into the whole polymer network of the photoresist layer 120. Referring to FIG. 6, the resin layer 140 may then provide the hydrophobic layer having good mechanical strength, thus preventing layer or phase separation.

Figure 7:
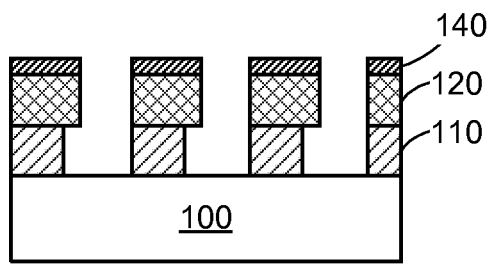

In step S60, development is performed to form a patterned photoresist layer having hydrophobic top surface as shown in FIG. 7. The development may be performed by a well known technique.

Example of patterned photoresist layer formed by the method according to the present disclosure may be a hPINP of the micro-fluid ejection head. Referring to FIG. 7, the micro-fluid ejection head may comprise the flow feature layer 110 formed on top of the substrate 100, and the photoimageable nozzle plate (PINP) 120 attached on top of the flow feature layer 110. The top surface of the PINP 120 may be treated with epoxy functionalized siloxane resin according to the method of the present disclosure presented in FIG. 1 to provide the hydrophobic layer 140, thus forming hPINP.

Hydrophobicity of a surface may be determined through contact angle measurement. Ink contact angles of the hPINP formed according to the method of the present disclosure, hereinafter referred to as hPINP1 are compared to ink contact angles of a pre-formed dual layer hPINP being laminated, imaged and developed on the micro-fluid ejection head structure. The inks used for the contact angle measurement have different surface tension to and include black ink (M1K), two types of cyan ink (S7C, P2C), and two types of magenta ink (S7M, P2M). The results of the ink contact angle measurements are shown in Table 1.

TABLE 1

| | | Ink Contact Angle (degrees) | | | |
| --- | --- | --- | --- | --- | --- |
| | Ink | Pre-formed Dual Layer hPINP | | hPINP1 | |
| Type of Ink | Surface Tension (dynes/cm) | Average | Standard Deviation | Average | Standard Deviation |
| P2C | 29.9 | 59.09 | 1.145 | 63.16 | 1.017 |
| P2M | 28.8 | 55.55 | 1.184 | 62.37 | 1.152 |
| S7C | 38.9 | 62.08 | 0.543 | 66.56 | 0.838 |
| S7M | 38.6 | 60.67 | 0.525 | 66.30 | 0.423 |
| M1K | 44.0 | 74.89 | 0.817 | 80.28 | 0.448 |

Figure 8:
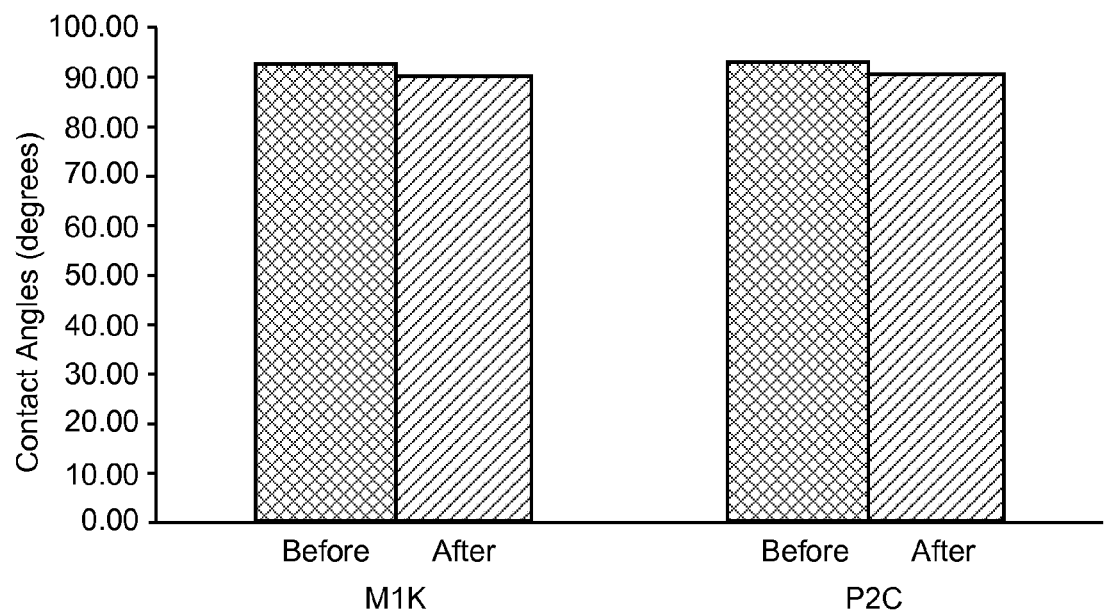
FIGS. 8-9 are graphical views of water contact angle measurements of hPINP.
Figure 9:
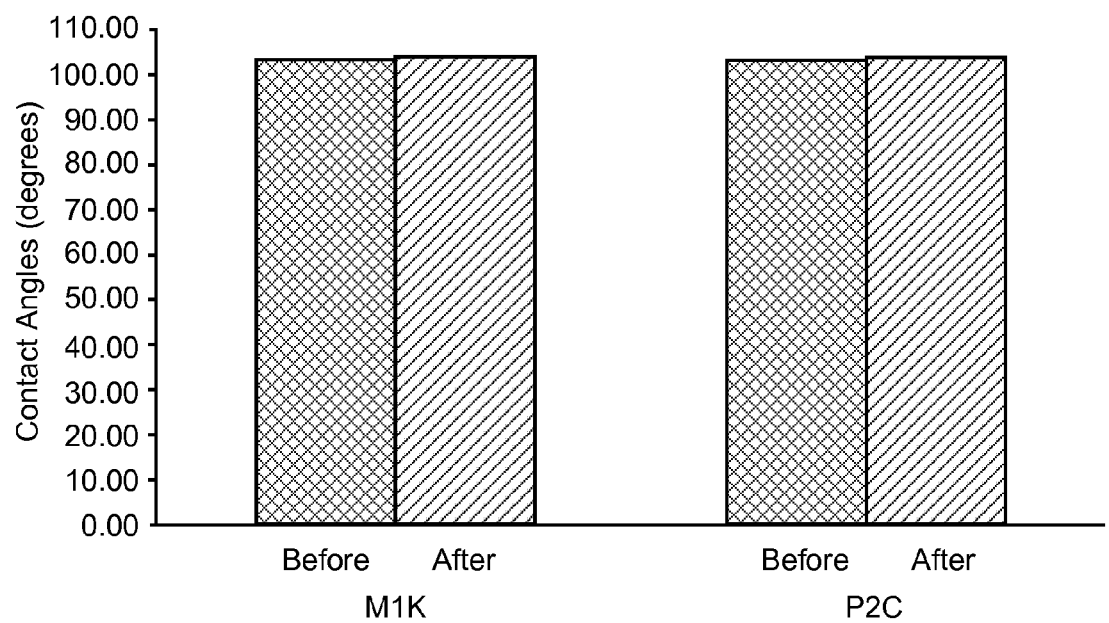

Referring to Table 1, the hPINP1 have higher ink contact angles compared to the ink contact angles of the pre-formed dual layer hPINP, thus having better hydrophobicity. Water contact angles of the hPINP1 and the pre-formed dual layer hPINP are measured before and after soaking in ink at a temperature of 60° C. for four days. The results of the water contact angle measurements are shown by FIGS. 8 and 9. The soaking ink includes black ink (M1K) and cyan ink (P2C). FIG. 8 shows the change of water contact angle measurements before and after ink soaking of the pre-formed dual layer hPINP. FIG. 9 shows the change of water contact angle measurement before and after ink soaking of hPINP1. The hPINP1 have a higher and more stable contact angle compared the pre-formed dual layer hPINP. The hPINP formed according to the method of the present disclosure has improved hydrophobicity which remains stable even after to long exposure to ink at higher temperature.

The foregoing description of several methods and embodiments has been presented for purposes of illustration. It is not intended to be exhaustive or to limit the disclosure to the precise acts and/or forms disclosed, and obviously many modifications and variations are possible in light of the above teaching. It is intended that the scope of the invention be defined by the claims appended hereto.

What is claimed is:

1. A method of forming a patterned photoresist layer having a hydrophobic surface, the method comprising:
    forming a photoresist layer on a substrate;
    image patterning the photoresist layer;
    performing first stage post-exposure bake to the imaged photoresist layer, wherein the imaged photoresist layer is partially baked;
    surface treating the partially post-exposure baked photoresist layer;
    performing second stage post-exposure bake to the surface treated partially post-exposure baked photoresist layer; and
    developing the second stage post-exposure baked photoresist layer in a single step.

2. The method of claim 1, wherein the photoresist layer comprises a polymeric material with photoacid generator.

3. The method of claim 1, wherein the surface treating includes applying siloxane solution on a top surface of the partially post-exposure baked photoresist layer, the siloxane solution comprising an epoxy functionalized siloxane resin dissolved in a hydrocarbon carrier solvent, the epoxy functionalized siloxane resin having at least two epoxy group per molecule.

4. The method of claim 3, wherein the epoxy functionalized siloxane resin comprises a terminal glycidyl ether group.

5. The method of claim 3, wherein the epoxy functionalized siloxane resin comprises a pendant glycidyl ether group.

6. The method of claim 3, wherein the epoxy functionalized siloxane resin comprises a pendant cyclohexene oxide group.

7. The method of claim 3, wherein the epoxy functionalized siloxane resin comprises a terminal cyclohexene oxide group.

8. The method of claim 3, wherein the hydrocarbon carrier solvent comprises aliphatic hydrocarbon.

9. The method of claim 3, wherein the hydrocarbon carrier solvent comprises aromatic hydrocarbon.

10. The method of claim 3, wherein the hydrocarbon carrier solvent comprises a mixture of aliphatic hydrocarbon and aromatic hydrocarbon.

11. The method of claim 3, wherein the siloxane solution does not contain photosensitive additive.

12. A method of forming a hydrophobic nozzle plate for a micro-fluid ejection head, comprising:
    laminating a photoresist dry film on a flow feature layer of a micro-fluid ejection head structure;
    image patterning the laminated photoresist dry film; performing first stage post-exposure bake to the imaged photoresist dry film, wherein the imaged photoresist dry film is partially baked;
    surface treating the partially post-exposure baked photoresist dry film;
    performing second stage post-exposure bake to the surface treated partially post-exposure baked photoresist dry film; and
    developing the second stage post-exposure baked photoresist dry film to form nozzles therein in a single step.

13. The method of claim 12, wherein the photoresist dry film comprises a polymeric material with photoacid generator.

14. The method of claim 12, wherein the surface treating includes applying siloxane solution on a top surface of the partially post-exposure baked photoresist layer, the siloxane solution comprising an epoxy functionalized siloxane resin dissolved in a hydrocarbon carrier solvent, the epoxy functionalized siloxane resin having at least two epoxy groups per molecule.

15. The method of claim 14, wherein the epoxy functionalized siloxane resin comprises a terminal glycidyl ether group.

16. The method of claim 14, wherein the epoxy functionalized siloxane resin comprises a pendant glycidyl ether group.

17. The method of claim 14, wherein the epoxy functionalized siloxane resin comprises a pendant cyclohexene oxide group.

18. The method of claim 14, wherein the epoxy functionalized siloxane resin comprises a terminal cyclohexene oxide group.

19. The method of claim 14, wherein the hydrocarbon carrier solvent comprises aliphatic hydrocarbon.

20. The method of claim 14, wherein the hydrocarbon carrier solvent comprises aromatic hydrocarbon solvent.

21. The method of claim 14, wherein the hydrocarbon carrier solvent comprises a mixture of aliphatic hydrocarbon solvent and aromatic hydrocarbon.

22. The method of claim 14, wherein the siloxane solution does not contain photosensitive additive.

\* \* \* \* \*